United States Patent [19]

Rogers, Jr.

[11] Patent Number: 4,753,818

[45] Date of Patent: Jun. 28, 1988

[54] PROCESS FOR PHOTOCHEMICAL VAPOR DEPOSITION OF OXIDE LAYERS AT ENHANCED DEPOSITION RATES

[75] Inventor: Harvey N. Rogers, Jr., Los Angeles, Calif.

[73] Assignee: Hughes Aircraft Company, Los Angeles, Calif.

[21] Appl. No.: 889,562

[22] Filed: Jul. 25, 1986

[51] Int. Cl.⁴ ............................................... B05D 3/06
[52] U.S. Cl. ..................................... 427/54.1; 437/238
[58] Field of Search ...................... 427/53.1, 54.1, 93; 437/238

[56] References Cited

U.S. PATENT DOCUMENTS

| | | | |
|---|---|---|---|
| 4,371,587 | 2/1983 | Peters | 427/53.1 |
| 4,581,248 | 4/1986 | Roche | 427/53.1 |
| 4,631,199 | 12/1986 | Hall et al. | 427/54.1 |

FOREIGN PATENT DOCUMENTS 59-28345  2/1984  Japan .
59-53674  3/1984  Japan .

Primary Examiner—Norman Morgenstern
Attorney, Agent, or Firm—Mary E. Lachman; A. W. Karambelas

[57] ABSTRACT

A process for depositing an oxide layer on a substrate by exposing the substrate to a selected vapor phase reactant, a chosen oxygen-containing precursor, and a selected physical quenching gas, in the presence of radiation of a selected wavelength. The radiation causes the direct dissociation of the oxygen-containing precursor to form neutral oxygen atoms in an excited electronic state. The quenching gas physically interacts with the oxygen atoms in the excited electronic state to form oxygen atoms in the unexcited electronic state. The latter then react with the vapor phase reactant to form the oxide, which deposits as a layer on the substrate. The rate of reaction to form and deposit the oxide layer is enhanced by the conversion of the excited electronic state oxygen atoms to unexcited electronic state oxygen atoms by the physical quenching gas.

3 Claims, 1 Drawing Sheet

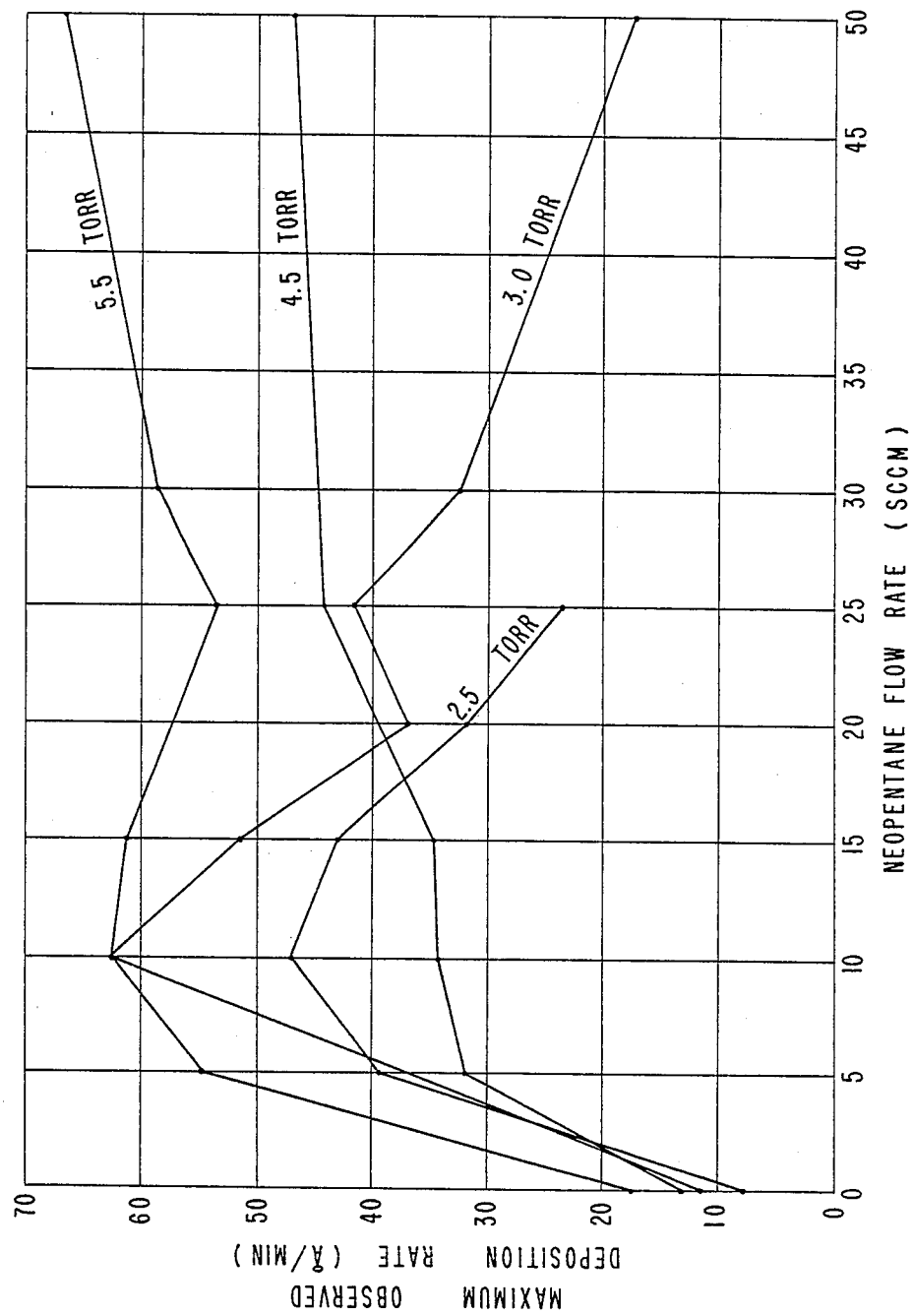

PROCESS FOR PHOTOCHEMICAL VAPOR DEPOSITION OF OXIDE LAYERS AT ENHANCED DEPOSITION RATES

BACKGROUND OF THE INVENTION

1. Field of the Invention

The present invention relates in general to the fabrication of semiconductor devices and optical structures and, more particularly, to a photochemical vapor deposition process for forming an oxide layer on the surface of a selected substrate, in a manner which enhances the rate at which the oxide layer is deposited.

2. Description of the Background Art

Oxide layers have been deposited on a substrate by a method that uses a photochemical reaction to generate neutral (non-ionized) oxygen atoms, which then react with a chosen vapor phase reactant to form the desired oxide, which deposits as a layer on the substrate. This photochemical vapor deposition process is disclosed in U.S. Pat. Nos. 4,371,587 and 4,419,385, both assigned to the present assignee, and is useful in the fabrication of various devices and structures, for depositing an insulator or passivation oxide layer on a semiconductor material, glass or plastic lens, metal layer, mirrored surface, or solar cell. The use of photochemically generated neutral oxygen atoms avoids substrate damage due to charge bombardment or radiation bombardment. In addition, such a photochemical vapor deposition process can be conducted at a low temperature which avoids substrate damage due to thermal effects. As disclosed in U.S. Pat. No. 4,371,587, the neutral oxygen atoms may be generated by the mercury photosensitized dissociation of an oxygen-containing precursor or by the direct dissociation of an oxygen-containing precursor. In the mercury-sensitized reaction, a substrate is exposed to a chosen vapor phase reactant, such as silane ($SiH_4$), an oxygen-containing precursor, such as nitrous oxide ($N_2O$), and mercury vapor in the presence of radiation of a predetermined wavelength (e.g. 2537 angstroms). The 2537 angstroms (Å) radiation excites the mercury atoms in the reactant gas mixture to form mercury atoms in an excited state (Hg*), approximately 5 electron volts above normal ground state, but non-ionized. The Hg* interacts with the oxygen-containing precursor, transfers energy to the precursor, and causes it to dissociate to produce atomic oxygen. The atomic oxygen than reacts with the vapor phase reactant to form the desired oxide, such as $SiO_2$ or SiO.

In the direct photodissociation method disclosed in U.S. Pat. No. 4,371,587, atomic oxygen is formed by the direct dissociation of the oxygen-containing precursor without the assistance of mercury sensitization. In this direct process, the substrate is exposed to a chosen vapor phase reactant, such as silane, and an oxygen-containing precursor in the presence of radiation of a predetermined wavelength sufficient to cause the direct dissociation of the oxygen-containing precursor to produce atomic oxygen. When nitrous oxide is used as the oxygen-containing precursor, radiation having a wavelength within the range of 1750 to 1950 Å is sufficient to cause the direct dissociation of the nitrous oxide to form atomic oxygen and nitrogen as shown in Equation (1) below. It is convenient to use 1849 Å radiation for this purpose since this is the resonance line of a low pressure mercury vapor lamp which is conventionally used as a radiation source. The atomic oxygen then reacts with the vapor phase reactant, such as silane, to form the desired oxide, such as silicon dioxide or silicon monoxide.

$$N_2O + hc/\lambda(1750-1950 \text{ Å}) \rightarrow O(^1D) + N_2 \qquad (1)$$

Where
- h = Planck's constant
- c = speed of light
- λ = wavelength of light

The notation of $O(^1D)$ represents a singlet-D oxygen atom, which is a neutral oxygen atom in its first excited state.

Alternatively, the atomic oxygen may be formed by the direct photochemical dissociation of molecular oxygen as shown in Equation (2) below or of nitrogen dioxide ($NO_2$) as shown in Equation (3) below or of similar known materials which are capable of being dissociated to atomic oxygen by a direct photochemical reaction.

$$O_2 + hc/\lambda(1750-1950 \text{ Å}) \rightarrow 2O(^3P) \qquad (2)$$

$$NO_2 + hc/\lambda(3500-6000 \text{ Å}) \rightarrow O(^3P) + NO \qquad (3)$$

The notation $O(^3P)$ represents a triplet-P oxygen atom, which is a neutral oxygen atom in its ground state. Since molecular oxygen alone can react spontaneously and uncontrollably with silane, it is necessary to inhibit this spontaneous thermal oxidation process in order to permit the formation of atomic oxygen and the reaction thereof with the silane. This inhibition is accomplished by carefully controlling the operating pressure and the ratio of reactant gases and properly diluting the molecular oxygen with nitrogen gas. Higher deposition rates may be achieved using molecular oxygen rather than $N_2O$ or $NO_2$ as discussed above. However, in the case of oxygen, the quality of the deposited film is degraded, and unwanted powder or particulates form throughout the deposition equipment.

With regard to deposition rates, the mercury-sensitized photochemical vapor deposition process for depositing oxide layers is advantageous because of its higher deposition rates as compared to the direct photochemical vapor deposition process. However, in certain situations, the presence of mercury vapor may be undesirable. For example, a mercury-free environment may be critical to certain semiconductor surface passivations and dielectric bulk properties in order to avoid the incorporation of mercury into the dielectric layer or semiconductor surface and the resulting degradation of the electrical properties of the device. In addition, due to health, safety, and environmental considerations, it is desirable to avoid the use of mercury. The direct photolysis process previously described avoids the problems due to mercury contamination. However, the direct photolysis process known in the art does not have sufficiently high deposition rates to make such a process of practical use in the fabrication of semiconductor devices.

Thus, a need exists in the industry for a photochemical vapor deposition process for oxides which does not require mercury vapor, and at the same time has sufficiently high deposition rates as to be practicable.

SUMMARY OF THE INVENTION

The general purpose of this invention is to provide a new and improved process for depositing an oxide layer on a chosen substrate by a photochemical vapor deposition process having enhanced deposition rates. This process possesses all of the advantages of the above prior art oxide deposition processes, while overcoming their above-mentioned significant disadvantages.

The above general purpose of this invention is accomplished by exposing the substrate to a selected vapor phase reactant, a chosen oxygen-containing precursor, and a selected physical quenching gas, in the presence of radiation of a selected wavelength. The radiation causes the direct dissociation of the oxygen-containing precursor to form neutral oxygen atoms in an excited electronic state. The quenching gas physically interacts with the oxygen atoms in the excited electronic state to form oxygen atoms in the unexcited electronic state. The latter then react with the vapor phase reactant to form the oxide, which deposits as a layer on the substrate. The rate of reaction to form and deposit the oxide layer is enhanced by the conversion of the excited electronic state oxygen atoms to unexcited electronic state oxygen atoms by the physical quenching gas.

Accordingly, it is a purpose of the present invention to provide a new and improved photochemical vapor deposition process for depositing an oxide layer on a substrate, in which mercury vapor is not required.

Another purpose of the present invention is to provide a direct photolysis process of the type described which has enhanced deposition rates that are of practical values.

Still another purpose of the present invention is to provide a direct photolysis process of the type described which has optimized efficiency.

The foregoing and other objects, features, and advantages of the present invention will be apparent from the following more particular description of the preferred embodiments of the invention, as illustrated in the accompanying drawing.

BRIEF DESCRIPTION OF THE DRAWING

The figure presents curves showing the deposition rates at various operating pressures for various flow rates of neopentane quenching gas used in practising the process of the present invention.

DETAILED DESCRIPTION OF THE INVENTION

In accordance with the process of the present invention, the direct photolysis process for depositing an oxide layer is conducted as generally described in U.S. Pat. No. 4,371,587, the details of which are incorporated herein by this reference. The selected vapor phase reactant contains the element for which the oxide is desired as the final product. Such vapor phase reactants include, for example, silane, trimethyl aluminum, trimethyl gallium, germane, diborane, trimethyl indium, titanium tetrachloride, tungsten hexafluoride, hafnium hydride, dimethyl zinc, zirconium acetylacetonate, tetraethyl lead, tetramethyl tin, tin chloride, and dimethyl cadmium. The substrate may be, for example, a semiconductor wafer such as silicon or mercury cadmium telluride, a glass or plastic lens, a metal layer in a multilayer semiconductor device, a mirrored surface, or a solar cell.

In the direct photolysis method as practiced in the art and previously described herein, the oxygen-containing precursor typically comprises either pure nitrous oxide or a mixture of oxygen in nitrogen. Pure nitrous oxide offers the advantage of controllability, but has the disadvantage of a very low deposition rate. A mixture of about 10 percent oxygen in nitrogen diluent gas provides a faster deposition rate than nitrous oxide. However, molecular oxygen is so reactive with metal precursors, such as $SiH_4$ or $Al(CH_3)_3$, that a spontaneous thermal reaction can occur in the reaction chamber or associated tubing and can cause serious problems such as uncontrollability, unwanted powder formation, and degradation of the reaction equipment.

In accordance with the present invention, I have discovered that the addition of a relatively small quantity of a physical quenching gas to a selected oxygen-containing precursor produces unexpectedly high oxide deposition rates.

The efficiency of the reaction between the vapor phase reactant, such as silane or trimethyl aluminum, and atomic oxygen in a photochemical vapor deposition process depends on the electronic state of the oxygen atoms. The unexcited electronic state or ground state, triplet-P oxygen atom, indicated as $O(^3P)$, is much more reactive with the vapor phase reactant for oxide thin film deposition than the excited state, singlet-D oxygen atom, indicated as $O(^1D)$, since the former undergoes an oxidative termination reaction of the type required to oxidize the vapor phase reactant, while the latter undergoes a chemical bond insertion reaction in which the oxygen is inserted between two bonded atoms. In addition, since $O(^3P)$ is the ground state atom, it cannot decay further to any other electronic state, making it more available for chemical reaction than $O(^1D)$.

In the prior art mercury-sensitized photochemical vapor deposition process previously discussed, the atomic oxygen is produced in the unexcited or ground state. Consequently, high deposition rates, e.g. 150 to 400 angstroms per minute, are observed for the deposition of silicon dioxide from silane and nitrous oxide reactants using mercury sensitization. By contrast, in the direct photochemical dissociation process using a nitrous oxide reactant, the atomic oxygen is produced in the excited state, $O(^1D)$, as previously indicated in Equation (1). However, this excited state atomic oxygen is relatively unreactive toward the silane or other vapor phase reactants. Some of the $O(^1D)$ is deactivated or quenched to the $(O^3P)$ or ground state by collisions with the chamber walls and with $N_2O$ reactant present in the chamber as represented in Equations (4) and (5) below, respectively.

$$O(^1D) \xrightarrow{wall} O(^3P) \qquad (4)$$

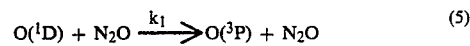

$$O(^1D) + N_2O \xrightarrow{k_1} O(^3P) + N_2O \qquad (5)$$

$k_1$ = rate constant
    = $1 \times 10^{-12}$ cm$^3$ molec$^{-1}$ s$^{-1}$
    (cubic centimeters per molecule per second)

Quenching can also occur with $N_2$ as indicated in Equation (6) below. The $N_2$ is produced by the photolysis process, as indicated in Equation (1) above.

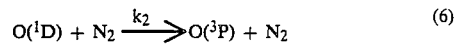

$$O(^1D) + N_2 \xrightarrow{k_2} O(^3P) + N_2 \qquad (6)$$

$k_2 = 2.6 \times 10^{-11}$ cm$^3$ molec$^{-1}$ s$^{-1}$

Through these processes, a small steady state concentration of $O(^3P)$ is established which reacts with silane reactant to form the oxide deposit. Competing chemical reactions with N₂O, however, remove most of the O(¹D) formed by the photolysis, as indicated in Equations (7) and (8) below.

$$O(^1D) + N_2O \xrightarrow{k_3} 2NO \quad (7)$$

$$k_3 = 7.2 \times 10^{-11} \text{ cm}^3 \text{ molec}^{-1} \text{ s}^{-1}$$

$$O(^1D) + N_2O \xrightarrow{k_4} N_2 + O_2 \quad (8)$$

$$k_4 = 4.4 \times 10^{-11} \text{ cm}^3 \text{ molec}^{-1} \text{ s}^{-1}$$

It is the inefficiency of the conversion of O(¹D) to O(³P) which is responsible for the low deposition rates (7-15 Å/min) observed with the direct photolysis process as practiced in the prior art.

I have discovered that the rate of conversion of O(¹D) to O(³P) is significantly enhanced by introducing an appropriate gas into the reactant gas mixture to act as a physical quencher for O(¹D). The energy difference between the O(¹D) and O(³P) electronic states is transferred by collisions to the rotational-vibrational modes of the quenching gas. This physical quenching effect is to be distinguished from a chemical quencher or scavenger which reacts chemically with the atomic oxygen and removes it from the reaction sequence. The term "physical quencher" or "physical quenching gas" is used herein to denote a gas which interacts physically by means of collisons with the excited oxygen atom and induces a transfer of energy from the excited atom to the quenching gas. The ideal O(¹D) quencher for the direct photolysis photo-CVD process of the present invention must meet the following requirements: (a) acts only as a physical quencher for O(¹D) and not a chemical quencher; (b) is chemically inert to the chosen oxygen-containing precursor; (c) is chemically inert to silane or other vapor phase reactant; and (d) is transparent to the radiation required to photodissociate the oxygen-containing precursor, such as 1849 Å radiation for N₂O. Suitable physical quenching gases for practising the process of the present invention include, but are not limited to, neopentane (C₅H₁₂), carbon dioxide, xenon, and nitrogen, with neopentane being the most preferred. A significant increase in deposition rate could be achieved using N₂ as a quencher as long as the flow of N₂ does not adversely affect other deposition characteristics, such as uniformity, film morphology, and stoichiometry. Considering these latter factors, it would be desirable to have a more efficient quenching gas so that large flow rates could be avoided. Carbon tetrachloride (CCl₄) and methane (CH₄) are more efficient O(¹D) quenchers than N₂, but they also act as chemical quenchers. The CCl₄ forms chlorine (Cl₂) and carbonyl chloride (COCl₂), and the CH₄ forms hydroxyl ion (OH) and methyl radical (CH₃), which may chemically interfere with the desired reaction to deposit the oxide film. By contrast, xenon is a purely physical quencher with a quenching rate constant about three times that of N₂. Carbon dioxide is a slightly more efficient quencher than xenon. Large molecules with many rotational-vibrational modes tend to be more efficient quenchers than small molecules. Neopentane (C₅H₁₂) has a quenching rate constant of $12 \times 10^{-10}$ and has been demonstrated as an efficient quencher for the direct photolysis photo-CVD SiO₂ process of the present invention as described in greater detail below.

Using the apparatus and process described in U.S. Pat. No. 4,371,587 for the third embodiment therein, the process of the present invention was performed on a 3-inch silicon wafer to deposit a layer of silicon dioxide (SiO₂). The vapor phase reactant was silane, the oxygen-containing precursor was nitrous oxide, and the physical quenching gas was neopentane. A low pressure mercury vapor lamp was used as the source of 1849 Å radiation. The fiqure presents experimental data for the maximum observed deposition rates (namely, near the center of the bulls' eye deposition pattern) at various operating pressures in practising the process of the present invention using various flow rates of neopentane. The silane, nitrous oxide, and neopentane were each contained in a separate chamber with an associated control valve or flow meter by which the flow rate of the respective gases was controlled. The flow rate of silane was about 0.4 standard cubic centimeters per minute (sccm); the flow rate was about 180 sccm for the nitrous oxide; the flow rate of the neopentane was varied from 0 to 50 sccm; and the operating pressure in the reaction chamber was varied from 2.5 to 5.5 torr (millimeters of mercury) or about 332 to 732 pascals. As can be seen from the data in the figure, higher deposition rates were generally observed with higher system pressures, as expected due to increased collision frequency and consequent quenching of the O(¹D). For a given system pressure, generally the deposition rate increased rapidly with the introduction of small neopentane flow rates. A higher neopentane flow rates (i.e. greater than about 10 sccm), the deposition rate decreased as a result of shorter residence time of the molecular species or recombination of the atomic oxygen. The optimum range of flow rates for neopentane was found to be 2-15 sccm, with the most noted improvement in deposition rates being achieved with neopentane flow rates of 2-10 sccm. The greatest deposition rate improvement due to neopentane quenching was observed for a system pressure of 3.0 torr using only 10 sccm neopentane, where the deposition rate increased from 11.5 Å/min. for zero sccm neopentane to 62.6 Å/min. for 10 sccm neopentane. Using this embodiment of the present invention, the deposition rate was enhanced by more than 5 times as compared to the deposition rate for the prior art process which is represented in the figure as zero sccm neopentane.

In additional tests of the process of the present invention, oxide deposition rates within the range of 34 to 63 angstroms per minute were obtained using flow rates of 0.2 to 1.5 sccm for silane, 50 to 200 sccm for nitrous oxide, and 0 to 50 sccm for neopentane, at pressures of 2.5 to 5.5 torr (332 to 732 pascals).

It should be noted that there was some evidence that the enhanced deposition rate was limited to an area near the center of the chamber, thereby producing a "bulls' eye" pattern in film thickness. Nevertheless, significant deposition rate enhancement is possible over a three-inch diameter circular area.

In order to address the important issue of carbon contamination in the deposited oxide film or otherwise poor stoichiometry due to the introduction of neopentane, several oxide films formed as described above were analyzed by Electron Spectroscopy for Chemical Analysis (ESCA). The results of the compositional analysis by ESCA are presented in Table I below.

TABLE I

RESULTS OF ESCA

| Sample No. | NeoPentane (sccm) | Silane (sccm) | N₂O (sccm) | Pressure (Torr) | Atom % C | Atom % O | Atom % Si |
|---|---|---|---|---|---|---|---|
| 1 | 0 | 0.4 | 180 | 3.0 | 12. | 55 | 31 |
| 2 | 5 | 0.4 | 180 | 3.0 | 7.2 | 61 | 31 |
| 3 | 30 | 0.4 | 180 | 4.5 | 8.4 | 59 | 31 |
| 4 | 30 | 0 | 180 | 3.0 | 15. | 17 | 63 |

The controls included in this study were sample 1 (no neopentane) and sample 4 (no silane). Sample 1 of Table I indicated that SiO₂ produced without neopentane is stoichiometric within experimental error. Sample 4 of Table I verified that neopentane is chemically inert to N₂O since the test results indicate the detection of the silicon wafer and small amounts of O and C from the native oxide on the wafer and from organic contamination, respectively. The C content of sample 4 is comparable to that of sample 1 and indicates that the neopentane does not cause additional organic contamination. In addition, it was verified by ellipsometric measurements that no appreciable thin film deposition occurred for sample 4. The silicon dioxide deposited in accordance with the process of the present invention as indicated in samples 2 and 3 of Table I showed no appreciable deviation from ideal SiO₂ stoichiometry, with no carbon contamination above the levels which are normally observed for SiO₂ deposited by the prior art photochemical vapor deposition process previously described.

Thus, the present invention provides a process for depositing an oxide layer on a substrate by photochemical vapor deposition using direct photolysis in which the rate of deposition of the oxide layer is significantly enhanced to levels having practical utility in a production environment. While not limiting the present invention to a particular theory of operation, it is believed that the quenching gas used in the present process physically quenches the excited state oxygen atoms, O(¹D), to the more reactive unexcited state oxygen atoms, O(³P), which then oxidize the vapor phase reactant. In accordance with the present process, the desired oxidative species O(³P) is produced in larger quantities and more efficiently than could be previously achieved. Moreover, this enhancement of the desired oxidative species by converting O(¹D) to O(³P) in accordance with the process of the present invention can be accomplished for any oxygen-containing precursor which can be directly photodissociated to form the O(¹D) species. For example, molecular oxygen can be directly photodissociated as shown in Equation (9) below to form equal amounts of O(³P) and O(¹D), as disclosed in the book entitled "Spectra of Diatomic Molecules," by Gerhard Herzberg, Van Nostrand Reinhold Company, New York, 1950 pp. 446–447.

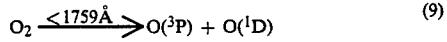
(9)

This molecular oxygen, diluted with an inert gas as previously discussed, can be used as the oxygen-containing precursor for the photochemical vapor deposition of oxide layers in accordance with the present invention, with the result that the quenching gas would double the amount of O(³P) formed and thus double the efficiency of the oxide deposition reaction. When using other oxygen-containing precursors besides those specifically discussed herein, the quenching gas must be chosen to be chemically unreactive with the selected oxygen-containing precursor. In addition, the enhancement of the O(³P) species produced by the present process is achieved independently of the vapor phase reactant, such as silane, trimethyl aluminum, etc., used. Thus, the present process may be used for any of the various vapor phase reactants previously discussed to provide significantly enhanced deposition rates for the corresponding oxides. Further, the process of the present invention can be readily controlled by controlling the reactant gas flow rates, reaction chamber pressure, and radiation intensity. Moreover, the process of the present invention does not use mercury and avoids the previously discussed problems associated therewith. In addition to avoiding the problems of possible mercury contamination, the process of the present invention is more controllable than a mercury-sensitized process in which surface evaporation depends on the prior history of the mercury, which cannot be readily controlled.

Having thus described exemplary embodiments of the present invention, it should be noted by those skilled in the art that the disclosures within are exemplary only and that various other alternatives, adaptations, and modifications may be made within the scope of the present invention. Accordingly, the present invention is not limited to the use of neopentane as a quenching gas, but includes other physical quenching gases meeting the requirements specified herein. In addition, the present invention is not limited to nitrous oxide as the oxygen-containing precursor, but includes other oxygen-containing precursors which can be directly photodissociated to form atomic oxygen in the excited electronic state, i.e., O(¹D). Further, it is not intended to limit the present invention to the deposition of a layer of silicon dioxide, which was used merely as an example, but it is intended to include the photochemical vapor deposition of other oxide materials, such as aluminum oxide, gallium oxide, germanium oxide, boron oxide, indium oxide, titanium dioxide, tungsten oxide, hafnium oxide, lead oxides, tin oxides, zinc oxide, zirconium oxide, tellurium oxide, and cadmium oxide.

What is claimed is:

1. A photochemical vapor deposition process for depositing a layer of an oxide of a chosen material on the surface of a selected substrate comprising the steps of:
   (a) providing said substrate; and
   (b) exposing said substrate to a selected vapor phase reactant comprising silane, a chosen oxygen-containing precursor comprising nitrous oxide, and a selected physical quenching gas comprising neopentane, in the presence of radiation having a wavelength of about 1849 angstroms to cause the direct dissociation of said oxygen-containing precursor to form neutral oxygen atoms in an excited electronic state wherein said quenching gas physically interacts with said oxygen atoms in said excited electronic state to form oxygen atoms in the unexcited electronic state and said oxygen atoms in said unexcited electronic state react with said vapor phase reactant to form said oxide comprising predominantly silicon dioxide, which deposits as said layer on said surface of said substrate at an enhanced rate of deposition.

2. The process of claim 1 wherein:
   (a) the flow rate of said silane is 0.2 to 1.5 standard cubic centimeters per minute (sccm);

(b) the flow rate of said nitrous oxide is 50 to 200 sccm;

(c) the flow rate of said neopentane is about 2 to 10 sccm; and (d) the pressure at which said process is performed is within the range of about 2.5 to 5.5 torr (332 to 732 pascals); and (e) the rate of deposition of said oxide is within the range of about 34 to 63 angstroms per minute.

3. The process of claim 1 wherein the flow rate of said neopentane is within the range of about 2 to 15 standard cubic centimeters per minute.

* * * * *